US005153432A

United States Patent [19]

Devant et al.

[11] Patent Number: 5,153,432

[45] Date of Patent: Oct. 6, 1992

[54] ION SOURCE FOR QUADRUPOLE MASS SPECTROMETER

[76] Inventors: Gérard Devant, 94, rue Broca, 75013 Paris; Robert Evrard, 5, rue Carnot, 95690 Nesle la Vallée; Olivier Maulat, 6, Place Auguste Rodin, 95110 Sannois, all of France

[21] Appl. No.: 643,762

[22] Filed: Jan. 22, 1991

[30] Foreign Application Priority Data

Jan. 26, 1990 [FR] France ............................... 90 00951

[51] Int. Cl.[5] ............................................. H01J 37/08

[52] U.S. Cl. .................................... 250/292; 250/427; 313/363.1

[58] Field of Search ........................ 250/292, 288, 427; 313/360.1, 363.1

[56] References Cited

U.S. PATENT DOCUMENTS 2,909,697 10/1959 Bernas et al. .................... 313/363.1
3,484,603 12/1969 Bloom et al. .
3,557,365 1/1971 Delany et al. .
3,560,734 2/1971 Barnett et al. ...................... 250/292
3,617,736 11/1971 Barnett et al. ...................... 250/292
3,678,267 7/1972 Werner .
3,758,777 9/1973 Brunnee et al. .
4,066,894 1/1978 Hunt et al. .
4,620,102 10/1986 Watanabe et al. .................. 250/427
4,891,515 1/1990 Jones et al. ......................... 250/427

OTHER PUBLICATIONS

"Catadioptric Electron Optics . . . " by R. Evrard, Advances in electronics and electron physics, 1978.

*Primary Examiner*—Bruce C. Anderson
*Attorney, Agent, or Firm*—Nikolay Parada

[57] ABSTRACT

An ion source for a quadrupole mass spectrometer comprises, from the upstream end to the downstream end in the axis of the quadrupole, an ionization chamber with heated filament and electrostatic field associated with an electron-optical system provided with an electron convergence device. A uniform magnetic field is superimposed on the electrostatic field of the ionization chamber. The electron-optical system comprises a first extraction electrode having a downstream surface which is at least approximately spherical, a second coaxial electrode in the form of a disk having a central orifice of relatively substantial width and, at a short distance, a third electrode in the form of a disk having a relatively small central orifice, the potentials of the electrodes being so adjusted as to form hemispherical equipotential surfaces between the first and the second electrode.

5 Claims, 1 Drawing Sheet

ION SOURCE FOR QUADRUPOLE MASS SPECTROMETER

BACKGROUND OF THE INVENTION

1. Field of the Invention

The present invention relates to an ion source for a quadrupole mass spectrometer.

2. Description of the Prior Art

A source of this type is disclosed in U.S. Pat. No. 4,006,894, the teachings of which are considered here by way of reference. The source comprises, from the upstream end to the downstream end in the axis of the quadrupole, an ionization chamber with heated filament and electrostatic field associated with an electron-optical system provided with an electron convergence device.

By reason of the symmetry of revolution imposed by the quadrupole filter, known ion sources for quadrupoles are so designed as to produce a circular beam directly. To this end, manufacturers employ an ion chamber having an exit in the form of a circular orifice followed by a focusing electron lens, the complete assembly being placed in the axis of the quadrupole filter.

In practice, the limitations in size of the circular orifice impose a restriction on the maximum sensitivity of this device.

The aim of the invention is to propose a novel configuration of an ion source for a quadrupole spectrometer which permits a considerable improvement in sensitivity.

SUMMARY OF THE INVENTION

The improved ion source in accordance with the invention is distinguished by the following features :

- a uniform magnetic field is superimposed on the electrostatic field of the ionization chamber,
- the electron-optical system comprises at least a first extraction electrode having a downstream surface which is at least approximately spherical, a second coaxial electrode in the form of a disk having a central orifice of relatively substantial width, and, at a short distance, a third electrode in the form of a disk having a relatively small central orifice, the electrode potentials being so adjusted as to form at least approximately hemispherical equipotential surfaces between the first and the second electrode.

This configuration of the electron-optical system makes it possible to employ, instead of a circular exit of the ionization chamber, an exit in the form of a rectangular slit of the same type as those which are already known in conventional magnetic deflection spectrometers (in this conventional case, of course, the extraction slits are followed by linear electrodes for focusing on the magnetic analyzer entrance which is also linear).

Thus the invention permits conversion of an asymmetrical ion beam to a beam capable of passing through a small circular orifice by means of its special electron-optical system placed between the extraction system and the circular entrance of the analyzer. It is therefore possible to employ a large ionization volume and the potential is more constant throughout the ionization volume. The sensitivity is therefore improved.

Advantageously, the ionization chamber and the extraction electrode comprise, instead of a single central slit, two corresponding slits located outside the axis of the system in order to mask with respect to the quadrupole filter the parasitic photons derived from the source as well as the excited atoms or molecules and also in order to form within the ionization chamber an equipotential surface which is capable of being at least roughly superimposed on the thin electrostatic beam which is present therein.

The spherical electron-optical system employed is known per se in the field of image intensifier tubes with fluorescent screens and is designated as a "fountain" optical system. Reference may be made to the article entitled "Catadioptric electron optics" published in 1978 in "Advances in electronics and electron physics". However, the optical system is employed in this case for focusing electrons and not ions, and in a technical environment which is entirely different from that of the invention.

In U.S. Pat. No. 3,678,267, there is also known an ion source comprising an electrode having the shape of a concave trough and an approximately circular cross-section. However, consideration is given here to a repulsion electrode placed within the ionization chamber itself and not to an extraction electrode. In consequence, the known electrode serves to focus electrons and not ions. Furthermore, the cited patent is not concerned with a quadrupole spectrometer but relates to a magnetic sector device in which the conditions of admission of ions are wholly different.

The advantages of the system in accordance with the invention are naturally related in part to the qualities of the optical system which makes it possible without any loss of sensitivity to introduce the ion beam into the quadrupole through a very small diaphragm. The third electrode thus constitutes a very effective screen for the parasitic photons derived from the source and for the excited atoms or molecules. By virtue of the magnetic field of the source, the introduction of light ions (hydrogen and helium) is also prevented by this third electrode.

Moreover, the small size of the diaphragm makes it possible to maintain a high pressure gradient between the source and the quadrupole. The quadrupole is thus capable of operating at lower pressure, thus improving practically all its performances (resolution, signal-to-noise ratio, and so on).

DETAILED DESCRIPTION OF THE INVENTION

Figure 1:
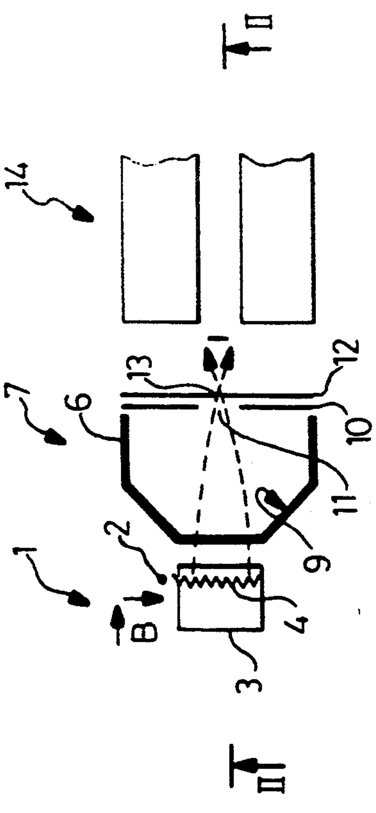
FIG. 1 is a schematic horizontal sectional view of the ion source and of its optical system in accordance with the invention, this view being taken along line I—I of FIG. 2.

FIG. 1 shows the ion source 1 proper, customarily consisting of a heated filament 2 which emits accelerated electrons at a voltage of 70 V, for example, within a substantially closed ionization chamber 3.

A uniform magnetic field represented by the induction vector $\vec{\mathbf{B}}$ is superimposed on the electrostatic field in accordance with known practice in magnetic deflection mass spectrometers. There is therefore obtained a thin flat electron beam 4 which is confined magnetically and maintained throughout the chamber 3 (through a lateral slit of the chamber). The efficiency of an ionization chamber of this type placed in a magnetic field is 20 to 30 times higher than that of purely electrostatic systems.

The extraction of ions takes place through one or a number of extraction slits 5 provided on the front face of the chamber 4, by means of an extraction electrode 6 forming part of the electron-optical system 7. The face of the extraction electrode 6 opposite to the chamber 4 is also provided with corresponding introduction slits 8 (having the same length but slightly narrower than the slits 5).

Figure 2:
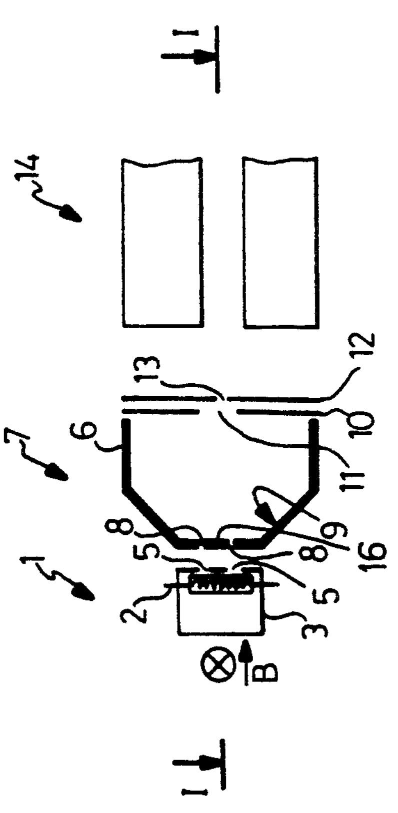
FIG. 2 is a perpendicular sectional view taken along line II—II of FIG. 1.

The extraction electrode 6 is of revolution and at least its downstream face 9 is of approximately spherical shape and may be formed, for example, by at least three frusto-conical connections having various semivertical angles within the range of 0° to 90° (0°, 45° and 90°) in FIGS. 1 and 2.

The optical system comprises a second electrode 10 constituted by a disk which is coaxial with the electrode 6 and provided with a circular central orifice 11 of fairly substantial width (8 mm, for example). At a short distance in front of the second electrode 10, a third coaxial electrode 12 in the form of a disk is provided with a very small central orifice 13 (2 mm to 0.5 mm, for example).

Finally, the quadrupole filter 14 whose axis coincides with the axis of the systems 1 and 7 is located in front of the optical system. The construction of the quadrupole filter as well as the construction of the analytical system which follows the filter do not form part of the invention. Reference may be made to the known technical literature, for example to U.S. Pat. No. 4,066,894.

The operation of the system is as follows:

By adjusting the potentials of the electrodes 6, 10 and 12, the wide beam extracted from the chamber 4 can be exactly focused on the small orifice 13 located at the crossover (point at which all the mean paths cross the axis of symmetry of the system) of the electron-optical system (7=6, 10, 12). The potentials are in fact adjusted so as to ensure that the equipotential surfaces 17 through the orifice 11 of the second electrode 10 are substantially half-spheres which are concentric with the first electrode 6, 9. The field between the electrodes is therefore perfectly radial. The crossover is strictly defined and independent of the starting position of the charged particle on the first electrode, with the result that the orifice 13 located in the third electrode at the level of the crossover can be very small. By virtue of the large area of the ionization electron beam, the sensitivity of the ion source is high.

Figure 3:
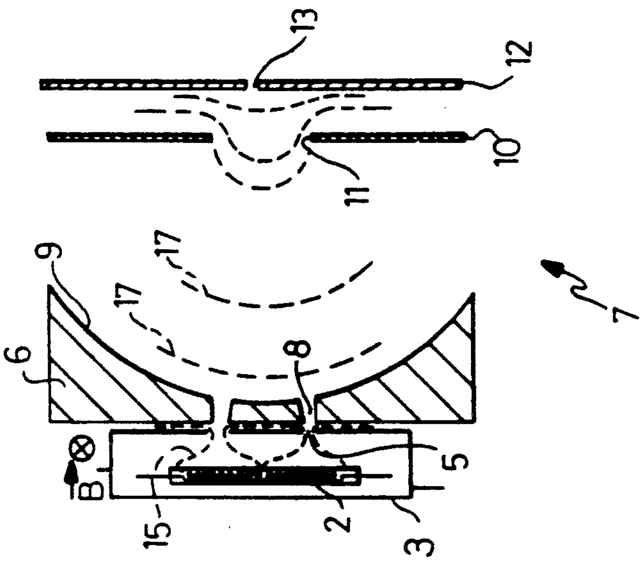
FIG. 3 is a view which is similar to FIG. 2 and shows the shape of the field in the optical system.

Moreover, this magnetically confined flat electron beam is very thin (0.5 mm, for example) and practically superimposed, by virtue of the two slits, on an equipotential surface 15 of the extracting field (FIG. 3). The initial ionic energy dispersion is therefore very slight, the chromatic aberration is small and the position of the crossover is perfectly defined.

The radius of the orifice 13 which can be very small (0.5 mm, for example) constitutes the entrance of the quadrupole 14. This small passageway permits a high pressure gradient between the chamber 4 and the quadrupole 14. The ideal conditions of operation, on the one hand of the ion source at high pressure and on the other hand of the quadrupole 14 at low pressure, are thus obtained.

By virtue of the high intrinsic sensitivity of the system in accordance with the invention, the energy of the ionization electrons can be reduced to an appreciable extent. This achieves a corresponding reduction of molecular cracking and an improvement in the proportion of molecular ions with respect to the total ion current. It is therefore possible to carry out a finer specific analysis and the resolution can be very high by virtue of the low initial ionic energy dispersion.

As can be seen in the figures, the two parallel extraction slits 5 (and therefore the slits 8) are not located in the axis of the system. A front portion 16 of the chamber 4 meets said axis, with the result that the chamber 4 is not in direct line of sight with the orifice 13 and therefore with the quadrupole 14. This avoids parasitic currents produced by the photons which result from ionic recombinations and molecular de-excitations at the level of the chamber 4 and improves the signal-to-noise ratio.

A further advantage of this two-slit geometry is that it has the effect of flattening the equipotential surfaces of the extracting field within the chamber. The "curtain" of ionizing electrons which is confined by the magnetic induction is therefore practically superimposed on one of these surfaces and the extracted ions are practically monokinetic, thus improving the resolution of the quadrupole.

Finally, the influence of the magnetic field (approximately 600 Gauss), which is negligible on the path of the heavy ions, nevertheless makes it possible in combination with the focusing in accordance with the invention to prevent introduction of helium ions which are very abundant in certain applications. The signal-to-noise ratio is thus improved even further. The helium ions are in fact deflected to a slight extent but sufficiently to be unable to pass through the very small diaphragm of the third electrode. It should be noted that the usual magnetic fields for confining electrons within ion sources (and limited in value to about one hundred Gauss) would not be sufficient to achieve this object.

What is claimed is:

1. Ion source for quadrupole mass spectrometer, of the type comprising, from the upstream end to the downstream end in the axis of the quadrupole, an ionization chamber with heated filament and electrostatic field associated with an electron-optical system provided with an electron convergence device, comprising:

means for superimposing a uniform magnetic field on the electrostatic field of the ionization chamber, the electron-optical system comprising at least a first extraction electrode having a downstream surface which is at least approximately spherical, a second coaxial electrode in the form of a disk having a central orifice of relatively substantial width and, at a short distance, a third electrode in the form of a disc having a relatively small central orifice, the electrode potentials being so adjusted as to form at least approximately hemispherical equipotential surfaces between the first and the second electrode, wherein ions formed within said ionization chamber are extracted by said first electrode and focused by said electron-optical system on said relatively small central orifice.

2. Ion source according to claim 1, wherein the ionization chamber and the extraction electrode have at least two corresponding slits located outside the axis of the system.

3. Ion source according to claim 1, wherein the downstream surface of the extraction electrode is constituted by at least three frusto-conical segments having a semivertical angle within the range of 0° to 90°.

4. An ion source of claim 3, wherein said relatively small orifice is from about 0.5 millimeters to about 2 millimeters in diameter.

5. An ion source of claim 1, wherein said relatively small orifice is from about 0.5 millimeters to about 2 millimeters in diameter.

* * * * *